United States Patent
van Waasen et al.

(10) Patent No.: US 8,554,159 B2
(45) Date of Patent: Oct. 8, 2013

(54) DIRECT FM/PM MODULATION

(75) Inventors: Stefan van Waasen, Xanten (DE); Anna Miskiewicz, Munich (DE); Markus Hammes, Dinslaken (DE)

(73) Assignee: Intel Mobile Communications GmbH, Neubiberg (DE)

(*) Notice: Subject to any disclaimer, the term of this patent is extended or adjusted under 35 U.S.C. 154(b) by 551 days.

(21) Appl. No.: 12/757,274

(22) Filed: Apr. 9, 2010

(65) Prior Publication Data

US 2011/0250856 A1 Oct. 13, 2011

(51) Int. Cl.
*H04B 1/04* (2006.01)

(52) U.S. Cl.
USPC .............. 455/112; 455/118; 455/216

(58) Field of Classification Search
USPC ........ 455/110, 112, 113, 118, 126, 147, 205, 455/216, 323
See application file for complete search history.

(56) References Cited

U.S. PATENT DOCUMENTS

| | | | | | |
|---|---|---|---|---|---|
| 4,755,774 | A | * | 7/1988 | Heck | 332/123 |
| 6,681,101 | B1 | * | 1/2004 | Eidson et al. | 455/127.1 |
| 6,873,218 | B2 | * | 3/2005 | Khlat | 332/103 |
| 7,120,396 | B2 | * | 10/2006 | Wilson | 455/108 |
| 7,453,325 | B2 | * | 11/2008 | Hammes et al. | 332/127 |
| 7,587,180 | B2 | * | 9/2009 | Maeda et al. | 455/110 |
| 7,979,038 | B2 | * | 7/2011 | Mitani et al. | 455/112 |
| 8,301,086 | B2 | * | 10/2012 | Groe et al. | 455/91 |
| 2004/0090909 | A1 | * | 5/2004 | Khlat | 370/215 |
| 2010/0330941 | A1 | * | 12/2010 | Trikha et al. | 455/180.1 |

* cited by examiner

*Primary Examiner* — Blane J Jackson
(74) *Attorney, Agent, or Firm* — Eschweiler & Associates, LLC

(57) ABSTRACT

Representative implementations of direct FM/PM modulation and systems are disclosed describing frequency modulation or phase modulation of information onto a carrier signal using a divider that is remote from the carrier signal generation path.

15 Claims, 10 Drawing Sheets

DIRECT FM/PM MODULATION

BACKGROUND

A conventional wireless transmitter implementing a system based on frequency modulation (FM) or phase modulation (PM), such as a mobile telephone, FM radio, Bluetooth® transmitter, and the like, generally requires a complex architecture to fulfill system performance requirements. Known architectures may be sensitive to design non-idealities, are characterized by high current consumption and design complexity, and in some implementations, limited with respect to achievable data rates. Commonly, a trade-off between current consumption, chip size, and/or architecture complexity may be made independent of the implemented standard (e.g., GSM, UTMS, FM/PM, Bluetooth®, etc.). However, any increase in the consumption of power, circuit area, or complexity is usually not desirable, especially in implementations integrated into smaller, new technology devices, including high frequency implementations.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Representative implementations of frequency modulation (FM) or phase modulation (PM) devices, methods, and systems are disclosed describing FM/PM modulation of a carrier signal. Modulation includes modifying a periodic carrier signal based on data or other information (voice, audio, video, etc.), such that the modified carrier signal varies in frequency (FM) or in phase (PM) with respect to the information. FM/PM modulation is disclosed using a divider that is remote from the carrier signal generation path. For example, the divider is not part of the carrier signal generation circuit(s). Consequently, effects of load-pulling or power supply pushing may not be transferred onto the modulated signal, since the divider is remote from the signal generation path. However, the divider receives and modulates the carrier signal.

Figure 1:
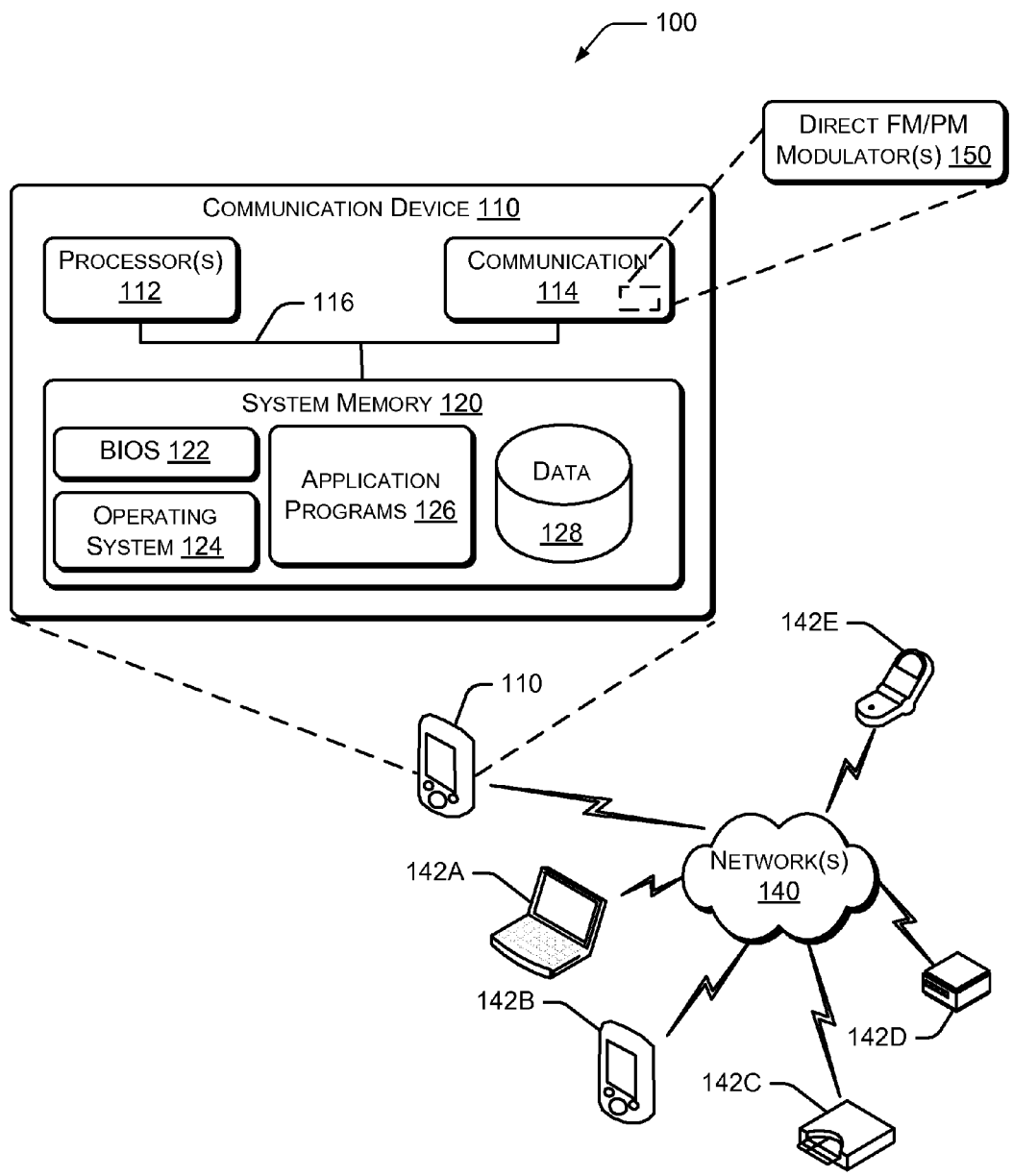
FIG. 1 is a representative environment in which direct FM/PM techniques in accordance with the present disclosure may be implemented.
Figure 2:
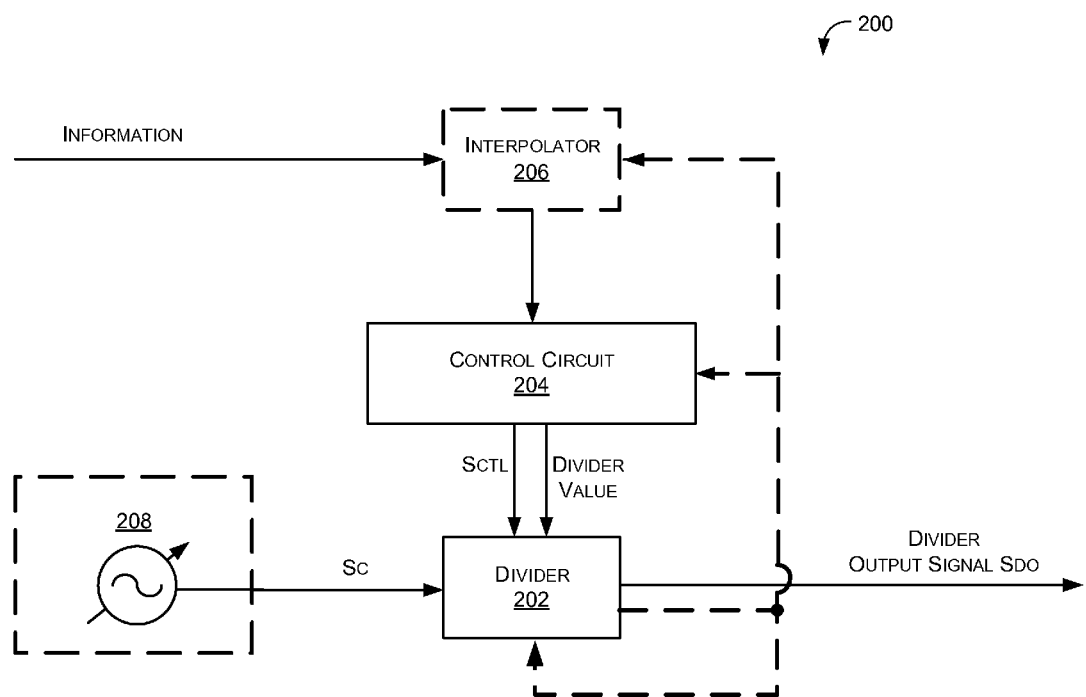
FIG. 2 is a schematic drawing of a first implementation of a system to provide direct FM/PM modulation.

A representative environment for implementing direct FM/PM modulation is shown in FIG. 1. An illustrative overview of direct FM/PM modulation is described with reference to FIG. 2, showing an example direct FM/PM modulator including two basic elements: a divider and a control circuit. In the example shown, the divider receives a carrier signal from a remote element, and also receives a control signal from the control circuit. The control signal is output from the control circuit based on information received at the control circuit. The divider modulates the information onto the carrier signal, using the control signal, and outputs a modulated signal.

Figure 3:
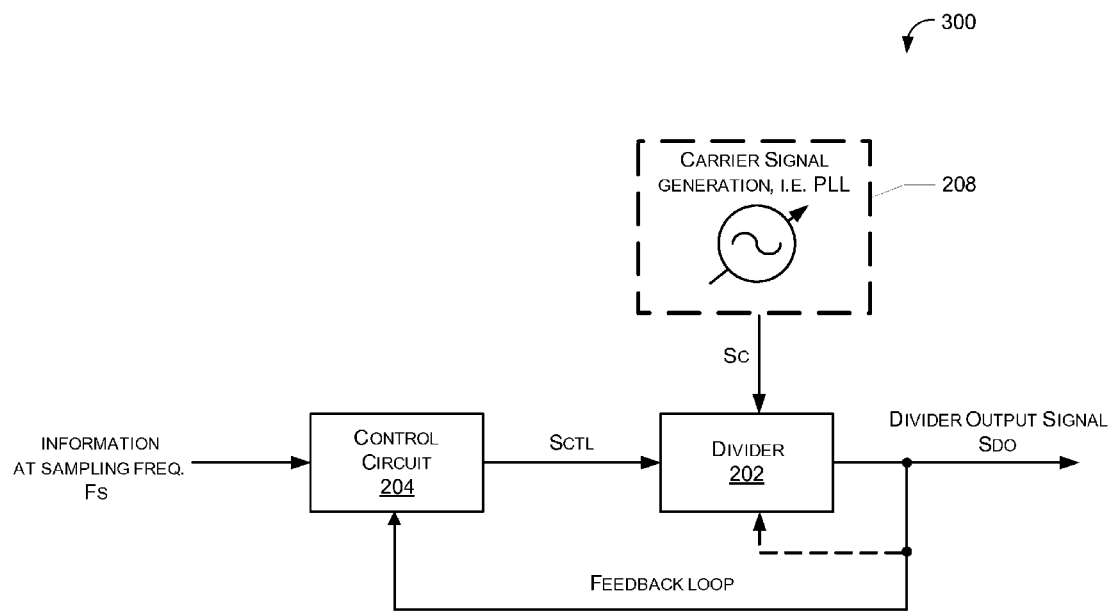
FIG. 3 is a schematic drawing of a second implementation of a system to provide direct FM/PM modulation, including a first configuration of a feedback loop.

In an alternate implementation of a direct FM/PM modulator, as shown in FIG. 3 and described with reference to FIG. 4, a feedback loop may be used to provide timing to the control circuit. A feedback loop feeds the modulated signal output from the divider into the control circuit. The control circuit thereby operates at the frequency of the modulated signal. Additionally or alternately, a feedback loop may be used to provide timing to the divider. The feedback loop, described as part of an implementation shown in FIG. 5 and described with reference to FIG. 6, feeds the modulated signal output from the divider back into an input of the divider. The divider thereby operates at the frequency of the modulated signal.

Figure 7:
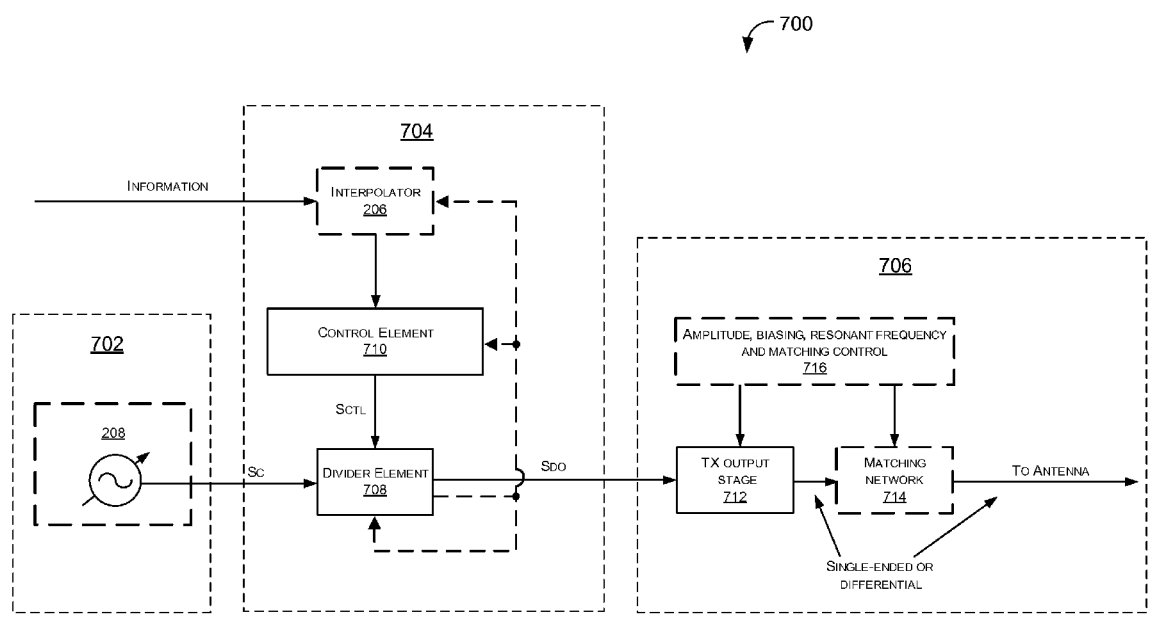
FIG. 7 is a schematic drawing of an implementation of a communication system using direct FM/PM modulation.

An example communication system implementing a direct FM/PM modulator is illustrated in FIG. 7. The communication system is described as having multiple stages, including a signal generation stage, a modulation stage, and a transmission stage, the transmission stage including a driver element for transmitting the modulated signal output from the divider.

Methods of performing direct FM/PM modulation are also disclosed. The methods are illustrated in flow diagrams shown in FIGS. 8 and 9.

An example electronic device implementing direct FM/PM modulation is discussed with reference to FIG. 10. The example electronic device includes a RF signal generation stage, a modulation stage, and a transmission stage, as well as supporting stages.

Implementations are explained in more detail below using a plurality of examples. Although various implementations and examples are discussed here and below, further implementations and examples may be possible by combining the features and elements of individual implementations and examples.

Representative Environment

FIG. 1 illustrates a representative environment 100 in which techniques in accordance with the present disclosure may be implemented. In this implementation, the environment 100 includes a communication device 110, or other mobile and/or electronic devices, having one or more direct FM/PM modulators 150 configured in accordance with the teachings of the present disclosure. The communication device 110 operatively communicates via one or more networks 140, such as wireless local area network (WLAN), with a plurality of other devices 142. Alternatively, the communication device 110 may bypass the networks 140 and communicate directly with one or more of the other devices 142. Detailed descriptions of various aspects of FM/PM modulation circuits, methods, and techniques are provided in the following sections with reference to FIGS. 2 through 10.

In the representative environment 100, the communication device 110 is a hand-held device, such as an MP3 (Moving Picture Exerts Group Layer-3) player, a personal data assistant (PDA), a global positioning system (GPS) unit, mobile telephone, smartphone, or other similar hand-held device, and the other devices 142 may include, for example, a computer 142A, another hand-held device 142B, a compact disc (CD) or digital versatile disc (DVD) player 142C, a signal processor 142D (e.g., radio, navigational unit, television, etc.), and a mobile phone 142E. In alternative implementations, the devices 110, 142 may include any other suitable devices, and it is understood that any of the plurality of devices 142 may be equipped with direct FM/PM modulator(s) 150 that operate in accordance with the teachings of the present disclosure.

As further shown in FIG. 1, the communication device 110 includes one or more processors 112 and one or more communication components 114 (e.g., transceivers, transmitters, receivers, etc.), coupled to a system memory 120 by a system bus 116. In the implementation shown in FIG. 1, the direct FM/PM modulator 150 is included as an element within the communication component 114 of the communication device 110. In alternative implementations, however, the direct FM/PM modulator 150 may be integrated with any other suitable portion of the device 110, or may be a separate, individual component of the device 110.

The system bus 116 of the communication device 110 represents any of the several types of bus structures, including a memory bus or memory controller, a peripheral bus, an accelerated graphics port, and a processor or local bus using any of a variety of bus architectures. The communication component 114 may be configured to operatively communicate with one or more external networks 140, such as a cellular telephone network, a satellite network, an information network (e.g., Internet, intranet, cellular network, cable network, fiber optic network, LAN, WAN, etc.), an infrared or radio wave communication network, or any other suitable network.

The system memory 120 may include computer-readable media configured to store data and/or program modules for implementing the techniques disclosed herein that are immediately accessible to and/or presently operated on by the processor 112. For example, the system memory 120 may also store a basic input/output system (BIOS) 122, an operating system 124, one or more application programs 126, and program data 128 that can be accessed by the processor 112 for performing various tasks desired by a user of the communication device 110.

Moreover, the computer-readable media included in the system memory 120 can be any available media that can be accessed by the device 110, including computer-readable storage media and communication media. Computer-readable storage media may include volatile and nonvolatile media, removable and non-removable media implemented in any method or technology for storage of information such as computer-readable instructions, data structures, program modules, or other data. Computer-readable storage media includes, but is not limited to, random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 110.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media.

Generally, program modules executed on the device 110 (FIG. 1) may include routines, programs, objects, components, data structures, email applications, and/or web browsers, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the representative environment 100 is shown as in FIG. 1 as a communication network, this implementation is meant to serve only as a non-limiting example of a suitable environment for use of the direct FM/PM modulator 150 in accordance with the present disclosure. Similarly, the device 110 is simply one non-limiting example of a suitable device that may include direct FM/PM modulators 150 in accordance with the present disclosure.

Example Direct FM/PM Modulator

FIG. 2 is a schematic drawing showing an illustrative overview of direct FM/PM modulation, using an example direct FM/PM modulator 200. It is to be understood that a direct FM/PM modulator 200 may be implemented as, or part of another system such as a TV tuner card, mobile communications system, Bluetooth® system, and the like. Further, an example direct FM/PM modulator 200 may be integrated into a transceiver platform independent of the reference and carrier frequencies used. This is because a modulated signal frequency (channel frequency) may be created as desired by dividing a carrier frequency with a divider value as described below. Because of its reduced complexity, lower power consumption, design effort minimization, and reduced physical area requirements, a direct FM/PM modulator 200 may be implemented successfully in the latest communications technologies, including technologies operating at high frequencies (for example, hundreds of megahertz).

In an example implementation, a direct FM/PM modulator 200 comprises a divider 202, and a control circuit 204. The divider 202 is electrically coupled to the control circuit 204, and receives a control signal $S_{CTL}$ at an input to the divider 202. The divider 202 (for example, a multi-modulus divider) modulates information onto a radio frequency (RF) carrier signal $S_C$ based on the control signal $S_{CTL}$ received from the control circuit 204. In alternate implementations, a direct FM/PM modulator 200 may comprise alternate or additional elements configured to perform the functions of direct FM/PM modulation as disclosed herein.

In one implementation, as shown in FIG. 2, information (e.g., communication information, data to be modulated onto the carrier signal, and/or transmit and/or receive channel information) is received at an input of the control circuit 204. The information may be any type of information desired to be communicated via a modulated carrier signal. For example the information may be voice communications, analog or digital signals, audio or video signals, programs, data, instructions, sequences, and the like. The information may be received by control circuit 204 from one or more input sources (e.g., microphone, camera, signal processor, analog to digital converter, server, data source, and the like).

In an alternate implementation, the information may be received by an interpolator 206 before being received by the control circuit 204. For example, the interpolator 206 may output the information to the control circuit 204. Additionally, in an implementation, the interpolator 206 may hold a data value from an information stream, until a next data value is received. In that way, the control circuit 204 consistently has a data value to use in its process, including between samples (or data points) of the information. In alternate implementations, the interpolator 206 may be a first, second, third, or n order interpolator, based on the implementation. In one implementation, the interpolator 206 is a zero order interpolator, with no additional device acting as an interpolator, the function of which being inherent in the information circuit path. In other implementations, additional or alternate elements or devices may perform an interpolation function in the information circuit path. For example, in one implementation, one or more flip-flops may be employed in the information circuit path to perform an interpolation function (i.e., holding a present data value until a next value is received).

A control signal $S_{CTL}$ is output from the control circuit 204, based on the information received at the input of the control circuit 204. In one example, the control signal $S_{CTL}$ comprises channel information, data information and a divider value. The divider value is determined by the control circuit 204, and may be based on an instantaneous frequency of the information received by the control circuit 204. For example, the divider value may reflect information about the modulating and channel data, including, for example, the frequency of that data. In one example implementation, the information may be received at the control circuit 204 at about 25 MHz. In alternate implementations, the information may be received at higher or lower frequencies.

The divider value determined by the control circuit 204 may be retained for use by the divider 202 (e.g., by using flip-flops, memory devices, etc.) until the control circuit 204 determines a new divider value. In one example, the control circuit 204 determines new divider values at the frequency of the information received by the control circuit 204. In other implementations, as discussed below, the control circuit 204 may determine new divider values at other intervals.

The control circuit 204 may be comprised of one or more elements or devices configured to output the control signal $S_{CTL}$. In one implementation, the control circuit 204 comprises a sigma-delta modulator. The sigma-delta modulator generates the divider value for the divider 202 based on the modulating and channel data received by the sigma-delta modulator. In alternate implementations, the control circuit 204 may be comprised of other elements or devices configured to output a control signal as described above.

Alternate implementations of a direct FM/PM modulator 200 may include feedback loops, as shown with the dashed line in FIG. 2. The feedback loops may feed an output of the divider 202 to various elements of the direct FM/PM modulator 200, such as the divider 202, the control circuit 204, and the interpolator 206. In alternate implementations, the feedback loops may feed the divider output signal ($S_{DO}$) or a separate output signal (a feedback signal) from the divider 202 to the various elements of the direct FM/PM modulator 200. For instance, the separate output signal (feedback signal) may be generated by various parts or stages of the divider 202. Example alternate implementations having feedback loops are described below with reference to FIGS. 3-6.

In an implementation, the divider 202 may also be electrically coupled to a carrier signal generation source 208. The divider 202 receives a RF carrier signal $S_C$ from the carrier signal generation source 208. The carrier signal generation source 208 may be a signal generation circuit (e.g., a phase locked loop (PLL), voltage controlled oscillator (VCO), crystal oscillator, etc.) which can generate a RF signal suitable as a carrier signal. In some implementations, the carrier signal may be about 6 GHz. In other implementations, the carrier signal may be higher or lower, based on the implementation.

Accordingly, in one example, the carrier signal generation source 208 can generate a RF signal of a fixed frequency that is stable over temperature and voltage, as well as process tolerances. If a PLL is used as a carrier signal generation source 208, both integer-N and fractional-N PLL types may be used, as long as the noise performance requirements of the system are met for the particular implementation (i.e., voice versus data). In one example, a PLL is tuned to a desired frequency, and it is kept in a locked state, generating a fixed, preprogrammed frequency, the generated carrier signal being received by the divider 202 at a carrier frequency $F_C$.

In one implementation, the divider 202 is remote from the carrier signal generation source 208. For example, the divider 202 is not part of the carrier signal generation source 208 circuit(s), and is not a part of the carrier signal generation path. For instance, if a PLL is used as a carrier signal generation source 208, the divider 202 is not part of the PLL loop. Accordingly, if other carrier signal generation sources 208 are used, the divider 202 is not part of the carrier signal generation path for the other sources. Consequently, effects of load-pulling or power supply pushing may not be transferred onto the modulated signal, since the divider 202 is remote from the signal generation loop of the PLL.

In an implementation, the divider 202 modulates the channel and data information received from the control circuit 204 onto the carrier signal $S_C$ received from the carrier signal generation source 208. For example, the divider 202 may divide the carrier signal $S_C$ with the divider value as part of modulating the information onto the carrier signal $S_C$. This division may be performed to generate a desired channel frequency, based on the implementation of the modulator 200. For example, the desired channel frequency may be about 100 MHz in one implementation, based on an FM radio implementation. In other implementations, the desired channel frequency may be higher or lower, based on other implementations.

Accordingly, a modulated signal at a frequency based on the frequency of the carrier signal divided by the divider value is created. The modulated signal is referred to in FIG. 2 as the divider output signal $S_{DO}$, and may be output by the divider 202 containing channel and data information. In alternate implementations, the modulated signal (divider output signal $S_{DO}$) may be a frequency modulated (FM) signal or a phase modulated (PM) signal. In one implementation, the modulated signal (divider output signal $S_{DO}$) may be used to control a transmitter stage of a communication device.

In one implementation, the divider 202 is a noise-shaping divider. The divider 202 may be configured to provide noise shaping based on the control signal received from the control circuit 204. For example, the divider 202 may be configured to provide noise shaping by transferring at least a portion of noise located within a predetermined range of the modulated signal frequency (the frequency of the divider output signal $S_{DO}$) to a preset frequency. The noise may be transferred to a frequency (e.g., a higher frequency, out of band frequency, etc.) where it may be filtered, for example, by a front end filter, antenna characteristics, or other frequency-selective components. In other implementations, the transferred noise may be reduced if not eliminated using other techniques. In one example implementation having a carrier signal frequency of 100 MHz, the divider 202 may be configured to transfer at least a portion of the noise present within the modulation bandwidth (for instance, 125 kHz) to a preset frequency of about 120 to 200 MHz (20-100 MHz offset from the carrier frequency of 100 MHz). Thus, the example implementation may include an antenna having a 5 MHz bandwidth, effectively filtering off the transferred noise. Alternate implementations may operate at other frequencies, while applying the noise shaping or noise transferring principles discussed.

Example Implementations

Figure 4:
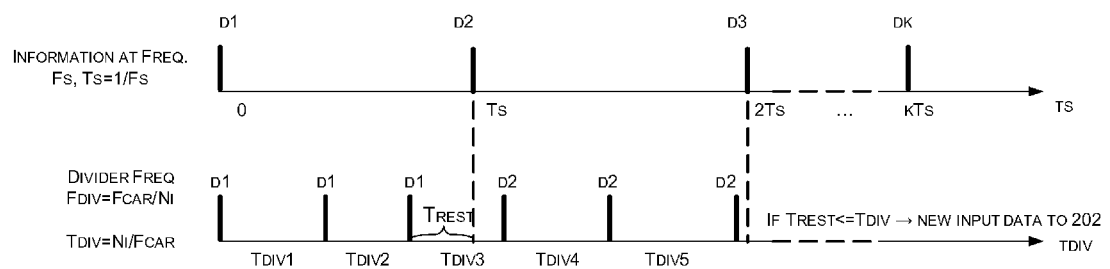
FIG. 4 is a signal diagram illustrating operation principles of the implementation of FIG. 3.

FIGS. 3 and 4 illustrate an implementation of direct FM/PM modulation according to one implementation using feedback, as shown by the example direct FM/PM modulator 300, illustrated in FIG. 3. FIG. 4 is a signal diagram illustrating operation principles of the direct FM/PM modulator 300, including signal timing.

In general, the example direct FM/PM modulator 300 operates as described with respect to the example direct FM/PM modulator 200. However, the direct FM/PM modulator 300 comprises the addition of at least one feedback loop. In one implementation, the direct FM/PM modulator 300 comprises a feedback loop configured to feed the modulated signal (divider output signal $S_{DO}$) into the control circuit 204, providing timing to the control circuit 204 and triggering the control circuit 204 to generate a divider value.

In one example implementation, information (i.e., communication information, generally including modulating data with channel information) is received by the control circuit 204 at a sampling frequency Fs. FIG. 4 shows a signal diagram illustrating the information at a frequency $F_S$, and having a period of $T_S$, where $T_S=1/F_S$. As discussed above, the control circuit 204 determines an instantaneous divider value (shown in FIG. 4 as $N_I$) based on the information received by the control circuit 204. The divider value $N_I$ is output from the control circuit 204 and received by the divider 202. The control circuit 204 calculates a new divider value when the divider 202 has finished a division of the carrier frequency $F_C$ with the previous divider value.

The divider 202 divides the carrier frequency $F_C$ by the divider value $N_I$ to determine a frequency for the divider output signal $S_{DO}$. This frequency is shown in the signal diagram as $F_{DIV}$, and has a corresponding period of $T_{DIV}$. As described above, the divider 202 outputs a divider output signal $S_{DO}$, at the modulated signal frequency $F_{DIV}$. In one example implementation, the divider output signal $S_{DO}$ is fed back from the output of the divider 202 into the control circuit 204. Thus, the frequency $F_{DIV}$ (and corresponding period $T_{DIV}$) generates a trigger signal for the control circuit 204 via the feedback loop.

In one implementation, the control circuit 204 determines a divider value $N_I$ when a trigger signal is present in the feedback loop, as described above. FIG. 4 illustrates an example of data flow from the control circuit 204 to the divider 202 based on the feedback loop providing timing to the control circuit 204. The information (shown as data points D1, D2, D3 . . . Dk) is received by the control circuit 204 at frequency $F_S$, but is output from the control circuit 204 and received by the divider 202 at frequency $F_{DIV}$ due to the feedback loop providing timing to the control circuit 204. If the time (shown as $T_{REST}$) from the beginning of a period $T_{DIV}$ to the reception of a new data point (D1, D2, D3, . . . , Dk) by the control circuit 204 (at frequency $F_S$) is less than or equal to the period $T_{DIV}$, then the new data point is sent to the divider 202 from the control circuit 204. Otherwise, the previous data point is repeatedly sent to the divider 202 from the control circuit 204. Accordingly, the divider 202 may be working with the same data point as long as the divider 202 is able to do a full division before a new data point arrives from the control circuit 204.

For example, as shown in FIG. 4, data point D1 is sent from the control circuit 204 to the divider 202 at the start of times $T_{DIV1}$, $T_{DIV2}$ and $T_{DIV3}$. New data point D2 arrives at the control circuit 204 during the time period $T_{DIV3}$, where $T_{REST}$ is less than $T_{DIV3}$. Thus, data point D2 is sent from the control circuit 204 to the divider 202 at the beginning of time period $T_{DIV4}$.

In this implementation, the instantaneous frequency at the divider 202 output represents not only the frequency of the modulated signal, but also represents the clocking frequency for the control circuit 204. Thus, the control circuit 204 operates at the instantaneous frequency $F_{DIV}$ of the divider output signal $S_{DO}$. With the control circuit 204 operating at a higher clocking frequency, the divider 202 may be more effective at noise-shaping, since the divider 202 will be receiving information data points at a higher frequency from the control circuit 204.

Figure 5:
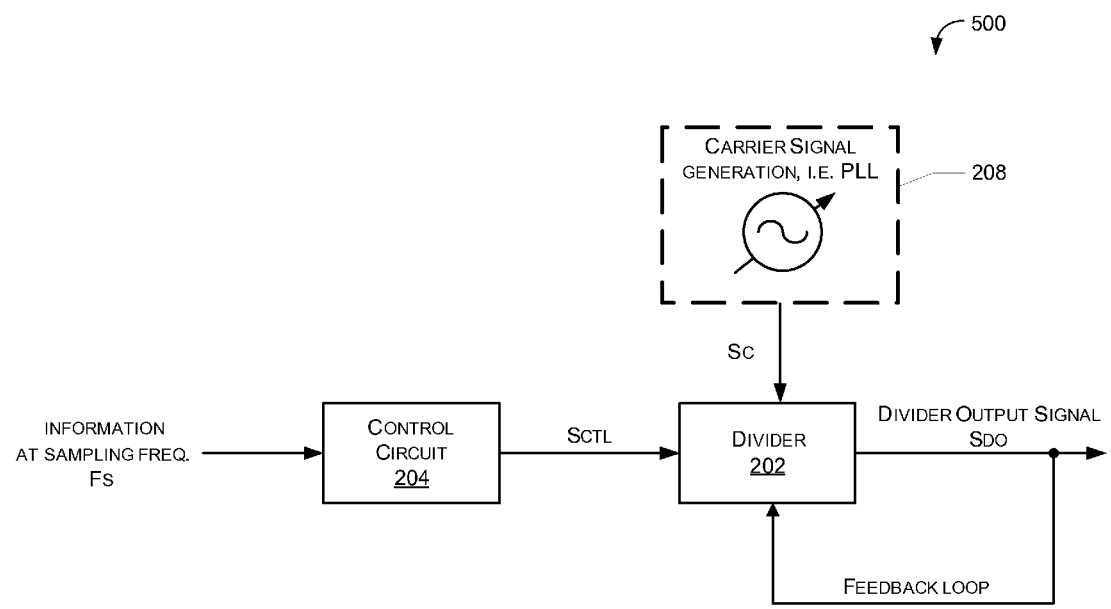
FIG. 5 is a schematic drawing of a third implementation of a system to provide direct FM/PM modulation, including a second configuration of a feedback loop.

In an alternate implementation, the control circuit 204 may receive a timing signal from one of the previous stages of the modulator 300, instead of from the output of the divider 202. For example, a timing signal may be fed to the control circuit 204 from another signal source (e.g., PLL, crystal oscillator, etc.), or from a signal processing circuit upstream of the control circuit 204 (as shown in FIG. 5, and discussed below). This may allow the control circuit 204 to run on a lower frequency with decreased current consumption. However, some increased noise at the divider output signal $S_{DO}$ may result due to a lower control circuit 204 frequency.

Alternately or additionally, the direct FM/PM modulator 300 may comprise a feedback loop from the output of the divider 202 back into the divider 202, as shown in FIGS. 3 and 5, and described with respect to an example direct FM/PM modulator 500 below.

Figure 6:
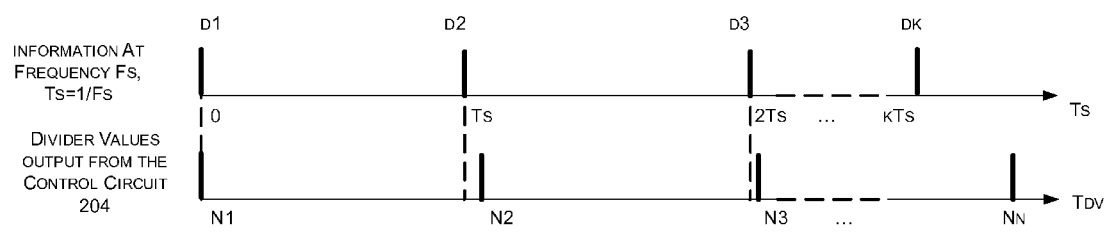
FIG. 6 is a signal diagram illustrating operation principles of the implementation of FIG. 5.

FIGS. 5 and 6 illustrate an implementation of direct FM/PM modulation according to another implementation using feedback. The implementation is shown via an example direct FM/PM modulator 500, illustrated in FIG. 5. FIG. 6 is a signal diagram illustrating operation principles of the direct FM/PM modulator 500, including signal timing.

In general, the example direct FM/PM modulator 500 operates as described with respect to the example direct FM/PM modulator 200. However, in one implementation, the direct FM/PM modulator 500 comprises the addition of a feedback loop configured to feed the modulated signal (divider output signal $S_{DO}$) back into the divider 202, providing timing to the divider 202.

In one example implementation, information is received by the control circuit 204 at a sampling frequency Fs. The sampling frequency $F_S$ may be a product of signal processing elements configured to output the information to the control circuit 204, as discussed above. FIG. 6 shows a signal diagram illustrating the information at a frequency $F_S$, and having a period of $T_S$, where $T_S=1/F_S$. As discussed above, the control circuit 204 determines an instantaneous divider value (shown in FIG. 6 as N1, N2, N3 . . . Nn) based on the information received by the control circuit 204. The divider value Nn is output from the control circuit 204 to the divider 202.

The divider value Nn is received by the divider 202, which divides the carrier frequency $F_C$ by the divider value Nn to determine a frequency for the divider output signal $S_{DO}$. As described above, the divider 202 outputs a divider output signal $S_{DO}$, at the modulated signal frequency $F_{DIV}$. In one example implementation, the divider output signal $S_{DO}$ is fed from the output of the divider 202 back into the divider 202.

As discussed with regard to the exemplary direct FM/PM modulator 500, the control circuit 204 determines a divider value Nn based on the instantaneous frequency of the information received by the control circuit 204. This is illustrated in the signal diagram of FIG. 6. As is shown, the information at frequency $F_S$ (shown as data points D1, D2, D3 ... Dk) is received by the divider 202 at frequency $F_S$ if there is no feedback loop triggering the control circuit 204. Accordingly, the divider 202 receives a new divider value Nn at the frequency that the control circuit 204 receives the information. Thus, the control circuit 204 is working according to its data input and at the data input frequency $F_S$.

However, since the divider output signal $S_{DO}$ is fed back into the divider 202, the divider 202 is working at the instantaneous frequency of the modulated signal (the divider output signal $S_{DO}$), which enables synchronization of the divider 202 input with a clocking frequency of the modulated signal. Thus, the divider 202 may sample the output of the control circuit 204 at the frequency of the modulated signal.

In this implementation, the divider 202 uses a new divider value Nn when it has closed the division with the previous divider value Nn.

Example Communication System

FIG. 7 is a schematic drawing of an implementation of a communication system 700 using direct FM/PM modulation according to one implementation. In one implementation, the communication system 700 comprises a signal generation stage 702, a modulation stage 704, and a transmission stage 706.

In one example, a signal generation stage 702 is configured to generate a radio frequency (RF) carrier signal. For example, the signal generation stage 702 may comprise a carrier signal generation source 208 as described above. The RF carrier signal may be output from the signal generation stage 702, and received by the modulation stage 704.

In one implementation, the modulation stage 704 is electrically coupled to the signal generation stage 702. In addition, the modulation stage 704 is also remote from the signal generation stage 702. For example, the modulation stage 704 is not part of the signal generation stage 702 circuit(s), and is not a part of the signal generation stage 702 signal paths. However, the modulation stage 704 receives the RF carrier signal output from the signal generation stage 702.

In one implementation, the modulation stage 704 includes a divider element 708 and a control element 710. The divider element 708 and the control element 710 operate in a similar manner as the divider 202 and the control circuit 204 described above. For example, in one implementation, the control element 710 receives communication information at an input of the control element 710. The control element 710 outputs a control signal based on the communication information and outputs an instantaneous divider value based on an instantaneous frequency of the communication information.

In one implementation, the divider element 708 is located outside of the signal generation stage 702. Similar to the description above, the divider element 708 modulates the communication information onto the RF carrier signal based on the control signal output by the control element 710. The divider element 708 also receives the instantaneous divider value, and divides the frequency of the RF carrier signal with the instantaneous divider value to produce a modulated signal frequency. The divider element 708 outputs the modulated signal at the modulated signal frequency.

In one implementation, the divider element 708 provides noise shaping as described above with respect to the divider 202. For example, the noise shaping may be based on the control signal received by the divider element 708. In one example, the divider element 708 shapes the noise by transferring at least a portion of the noise located within a predetermined range of the modulated signal frequency to a preset frequency. For instance, the divider element 708 may transfer close-in noise (noise within a predetermined range of the modulated signal frequency) to a much higher frequency, where the noise may be filtered off the signal.

In one alternate implementation, the modulation stage 704 may include a feedback loop to feed the modulated signal from the output of the divider element 708 into the control element 710. In one example, the modulated signal provides timing for the control element 710 and triggers the control element 710 to generate the instantaneous divider value.

Additionally or alternatively, the modulation stage 704 may include a feedback loop to feed the modulated signal from the output of the divider element 708 back into the divider element 708 to provide timing for the divider element 708. In other implementations, other feedback loops may be used, for example to provide timing or the like. Some example feedback loops are shown in dashed lines in FIG. 7. For example, in alternate implementations, a feedback loop (as illustrated in FIG. 7) may feed another signal (a feedback signal) from an output of the divider element 708 to a part of the modulation stage 704, where the feedback signal is not the modulated signal; for instance, it may be a signal from another stage or portion of the divider element 708.

In alternate implementations, the modulation stage 704 may include an interpolator 206 as described above with reference to FIG. 2. In one implementation, the interpolator 206 may be a zero-order interpolator as described above.

In one implementation, the transmission stage 706 is electrically coupled to the modulation stage 704. In one example, the transmission stage 706 includes a driver element 712 (TX output stage on FIG. 7) and an antenna (not shown). The driver element 712 outputs the modulated signal to the antenna for transmission of the modulated signal. Thus, the driver element 712 may include one or more amplifiers, filters, or similar elements configured to output the modulated signal to the antenna for transmission of the modulated signal. For example, in one implementation, the driver element may include a tuneable frequency and a tuneable output signal level, controllable via digital tuning algorithms based on on-chip measurements. In other implementations, the driver element 712 may include other tuning control and signal level techniques and methods.

In alternate implementations, the transmission stage 706 may also include elements or devices to improve efficiency, performance, and the like. These elements or devices may be included on a common chip, or may be remotely located. For example, the transmission stage 706 may include a matching network 714 to match the impedance of the transmission stage 706 to the antenna to optimize transmission power output. Further, in some implementations, the transmission stage 706 may include controls 716 coupled to the driver element 712 and the matching network 714. In alternate implementations, the controls 716 may be configured to control one or more of amplitude, biasing, resonant frequency, and impedance matching. The transmission stage 706 can be either single-ended or differential depending on the type of antenna used in alternate implementations.

Representative Methods

Figure 8:
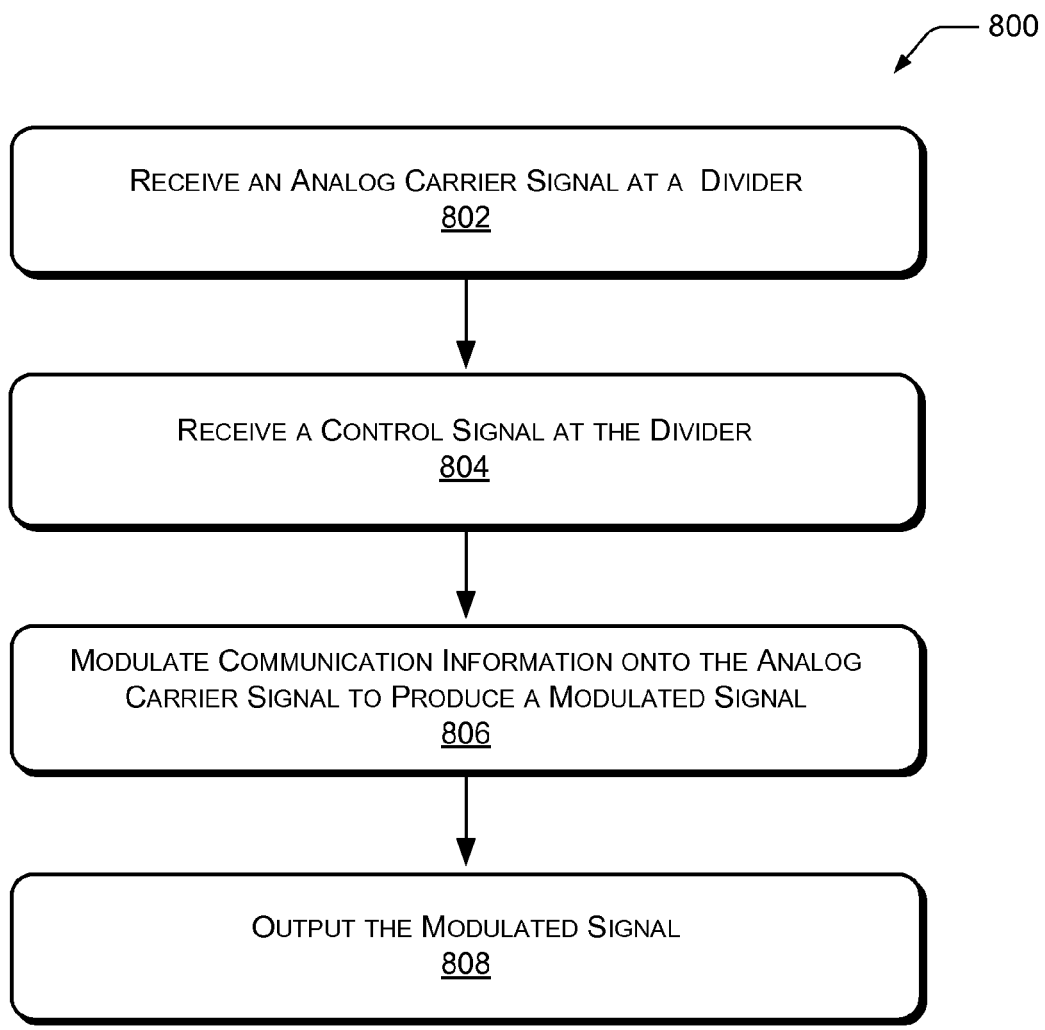
FIG. 8 is a flow diagram illustrating an example method of FM/PM modulation.
Figure 9:
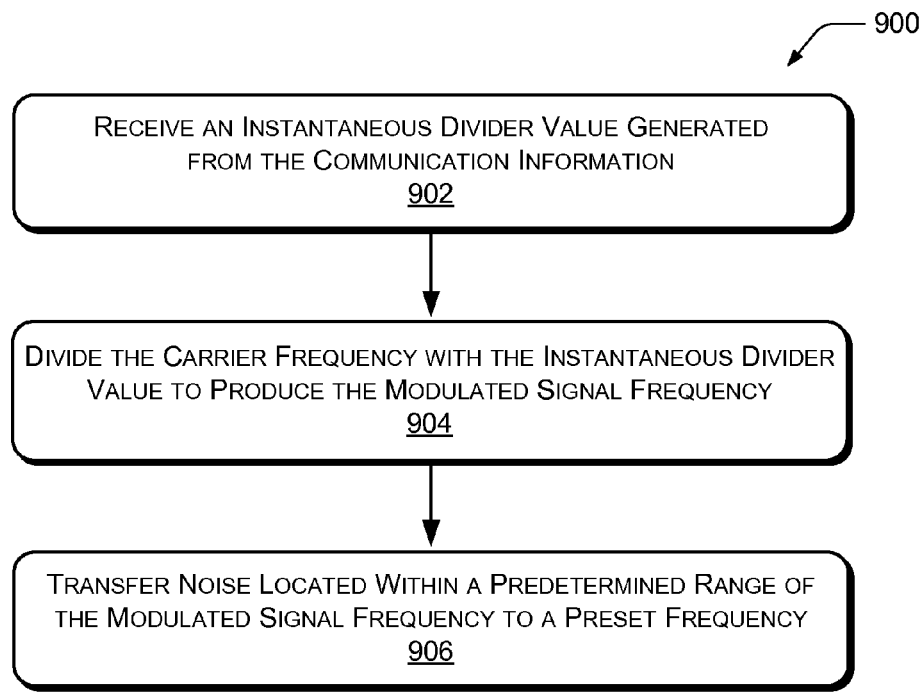
FIG. 9 is a flow diagram illustrating an example method of noise shaping.

FIG. 8 illustrates a representative method 800 for implementing direct FM/PM modulation, and FIG. 9 illustrates an example method 900 of noise shaping. The methods 800 and 900 are described with reference to FIGS. 2-7. In one implementation, the method 900 may be performed as part of the method 800. The order in which the methods are described is not intended to be construed as a limitation, and any number of the described method blocks can be combined in any order to implement the methods, or alternate methods. Additionally, individual blocks may be deleted from the methods without departing from the spirit and scope of the subject matter described herein. Furthermore, the methods can be implemented in any suitable hardware, software, firmware, or a combination thereof, without departing from the scope of the subject matter described herein.

At block 802, an analog or digital carrier signal is received at a divider, such as the divider 202 of FIGS. 2, 3, and 5. The carrier signal may be output by a carrier signal generation source (e.g., analog signal generator, voltage controlled oscillator (VCO), phase locked loop (PLL), crystal oscillator, digital clock source, etc.). In one implementation, the divider is remote from the carrier signal generation source, and remote from the carrier signal generation path. For example, the divider is not part of the carrier signal generation circuit(s), and is not a part of the carrier signal generation path(s).

At block 804, a control signal is received at the divider. In one implementation, the control signal is received from a sigma-delta modulator, and the control signal is based on communication information received by the sigma-delta modulator. The communication information may include voice signals or data signals, and/or a combination of the two. In the case of a voice signal, the source of the signal may be a microphone. If the communication information is a data signal, then the signal may include audio and/or video signals, or the like. In one implementation, the control signal additionally or alternatively includes a divider value. The divider value may be based on the communication information, (e.g., the frequency of the communication information).

At block 806, the communication information is modulated onto the analog or digital carrier signal, based on the divider value, to produce a modulated signal. The frequency of the modulated signal is the carrier signal frequency divided by the divider value. In one implementation, the modulation is performed by a divider, for example, a multi-modulus divider. In alternate implementations, the communication information is modulated onto the analog or digital carrier signal using frequency modulation or phase modulation.

At block 808, the modulated signal is output from the modulating element. For example, the modulated signal may be output from the divider. Thus, in alternate implementations, the modulated signal may be a frequency modulated (FM) signal or a phase modulated (PM) signal. In one implementation, the modulated signal is output to a transmitter driver to provide control to the transmitter driver. For example, in one implementation, the transmitter driver may transmit the modulated signal via an antenna.

In one implementation, the modulated signal output from the divider is fed back into the divider to provide timing. For example, the modulated signal may provide timing for the divider, synchronizing the operation of the divider with that of other elements or stages. For example, the input of the divider may be synchronized to elements coupled to the output of the divider. In another implementation, the modulated signal may be additionally or alternately fed into a control circuit to provide timing for the control circuit and to trigger the control circuit to generate a divider value. Thus, the control circuit may operate at the frequency of the modulated signal, including potentially generating a divider value at that frequency.

At block 902 of method 900 shown in FIG. 9, an instantaneous divider value is generated from the communication information described above with reference to block 804. In one implementation, the instantaneous divider value is generated by a sigma-delta modulator, and output to the divider. Further, the instantaneous divider value may be based on the frequency of the communication information.

At block 904, the divider divides the instantaneous divider value into the analog or digital carrier signal as part of modulating the communication information onto the carrier signal, to produce the modulated signal frequency. In one implementation, for example, the divider may divide the instantaneous divider value into the carrier signal to generate a desired channel frequency for the modulated signal, for transmission of the modulated signal.

At block 906, noise located within a predetermined range of the modulated signal frequency is transferred to a preset frequency. For example, noise that is close-in to the frequency of the modulated signal may be transferred to another frequency that is out of band with the transmitted frequency. Thus, the noise may not be transmitted with the modulated signal. In another example, the noise may be transferred to a high frequency, and filtered off using a front end filter, antenna characteristics, or other frequency-selective components. In alternate implementations, the amount of noise that is transferred may be based on the frequency of operation of the sigma-delta modulator. For example, more noise may be transferred with a higher frequency of operation than with a lower frequency of operation.

Representative Electronic Device

Figure 10:
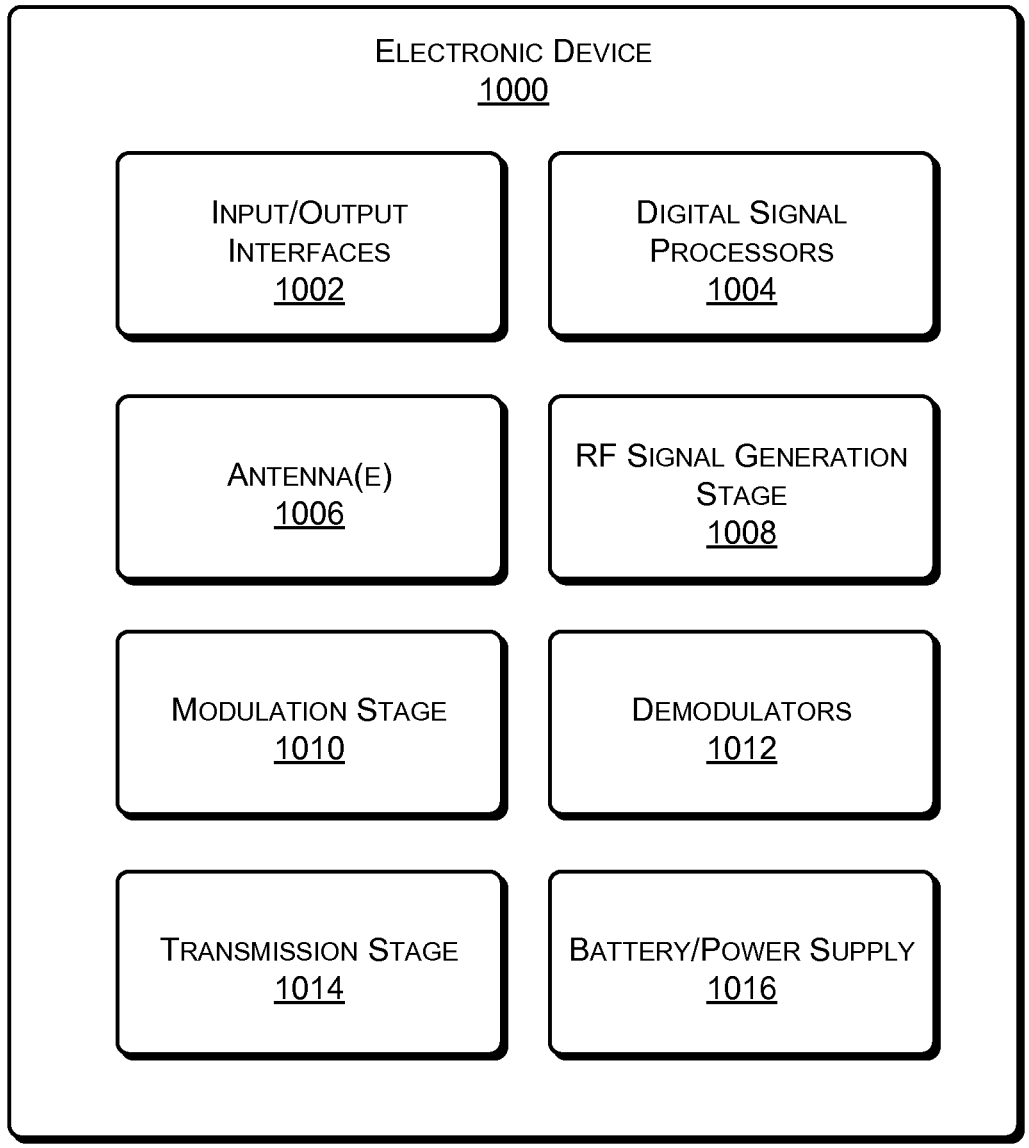
FIG. 10 illustrates an example electronic device implementing direct FM/PM modulation.

FIG. 10 illustrates an implementation of an electronic device 1000 implementing frequency or phase modulation using an example direct FM/PM modulator. The electronic device 1000 can include one or more input/output interfaces 1002 and Digital Signal processor(s) DSP 1004. Input/output interfaces 1002 can be used to connect input/output devices such as such as a microphone, a user screen, a user interface (e.g., keypad, touchpad, etc.), speakers, and so on to the electronic device 1000. The one or more digital signal processors 1004 can perform control and command functions, including accessing and controlling the components of the electronic device 1000. Digital Signal Processor(s) 1004 can be a single processing unit or multiple computing units.

The electronic device 1000 can further include one or more antennas 1006 for transmitting and receiving radio frequency (RF) signals, including transmitting the modulated signal as described above. The antennas 1006 may be configured to receive different radio frequencies in different bands. The antenna 1006 can include smart antennas, fractal antennas, microstrip antennas, and so on.

The electronic device 1000 may include a RF signal generation stage 1008 that can generate a RF carrier signal suitable for modulation. The RF signal generation stage 1008 may include a VCO to generate a stable carrier wave, which may include a PLL for a fixed frequency that is stable over temperature, voltage, as well as process tolerances. In other implementations, the RF signal generation stage 1008 may include other types of signal generation elements or devices.

A carrier signal generated by the RF signal generation stage 1008 may be modulated by the modulation stage 1010. In one implementation, the modulation stage 1010 may include a divider and a control circuit, as described above. In an implementation, the modulation stage 1010 may be remote from the RF signal generation stage 1008. For example, the modulation stage 1010 may not be a part of the RF signal generation stage 1008, or the RF signal generation path.

The output of the modulation stage 1010 may include a modulated signal. Further, the modulation stage 1010 may provide noise shaping to the modulated signal, transferring some if not all noise to a preset frequency (e.g., a higher frequency) to be filtered away from the modulated signal.

Demodulators 1012 can be included in the electronic device 1000 in order to demodulate a signal received via the antenna, and strip off the carrier frequency to obtain a baseband signal representing the information carried on the received signal.

A transmission stage 1014 may be included in the electronic device 1000 to transmit the modulated signal. Amplifiers and filters may also be present within the transmission stage 1014 to amplify the modulated signal and minimize the noise and distortion of the modulated signal in the useful band. The amplifiers can be power amplifiers, audio/video amplifiers, and so on. The filters in the electronic device 1000 can include pre-filters, noise shapers, digital filters, analog filters and so on. The electronic device 1000 also may include a battery or power supply 1016 to provide power to the electronic device 1000.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing the invention.

What is claimed is:

1. An electronic device comprising:
   a divider configured to: receive a radio frequency (RF) carrier signal from a generation source remote to the divider; receive a control signal; modulate the RF carrier signal based on the control signal; and output a modulated signal,
   wherein the divider is configured to provide noise shaping based on the control signal, the divider being configured to provide the noise shaping by transferring noise located within a predetermined frequency range of the modulated signal to a preset frequency, or
   wherein the divider is configured to divide a frequency of the RF carrier signal with a first divider value to produce a first modulated signal frequency, and the divider is configured to divide the frequency of the RF carrier signal with a second divider value to produce a second modulated signal frequency when the divider has closed the division with the first divider value.

2. The electronic device of claim 1, wherein the modulated signal is one of a frequency modulated (FM) signal or a phase modulated (PM) signal.

3. An electronic device comprising:
   a divider configured to: receive a radio frequency (RF) carrier signal from a generation source remote to the divider; receive a control signal; modulate the RF carrier signal based on the control signal; and output a modulated signal; and
   a control circuit electrically coupled to the divider, the control circuit configured to receive an input signal and to output the control signal based on the input signal, wherein:
      the control circuit is configured to output the control signal as a divider value based on an instantaneous frequency of the information input signal received by the control circuit; and
      the divider is configured to receive the divider value and divide a frequency of the RF carrier signal with the divider value to produce a modulated signal frequency.

4. An electronic device comprising:
   a divider configured to: receive a radio frequency (RF) carrier signal from a generation source remote to the divider; receive a control signal; modulate the RF carrier signal based on the control signal; and output a modulated signal;
   a control circuit electrically coupled to the divider, the control circuit configured to receive information and to output the control signal based on the information; and
   a feedback loop configured to feed a feedback signal into the control circuit, the feedback signal output by the divider, wherein the feedback signal provides timing for the control circuit and triggers the control circuit to generate a divider value, or
   a feedback loop configured to feed the modulated signal into the control circuit, wherein the modulated signal provides timing for the control circuit and triggers the control circuit to generate a divider value.

5. An electronic device comprising:
   a divider configured to: receive a radio frequency (RF) carrier signal from a generation source remote to the divider; receive a control signal; modulate the RF carrier signal based on the control signal; and output a modulated signal; and
   a feedback loop configured to feed a feedback signal, output by the divider, into the divider to provide timing for the divider, or
   a feedback loop configured to feed the modulated signal into the divider to provide timing for the divider.

6. A method comprising:
   receiving a carrier signal at a divider, the carrier signal received from a generation source remote from the divider;
   receiving a control signal at the divider from a control circuit, the control signal based on an instantaneous frequency of communication information received at the control circuit, wherein the control circuit comprises a sigma delta modulator;
   modulating the communication information onto the carrier signal to produce a modulated signal based on the control signal; and
   outputting the modulated signal.

7. The method of claim 6, wherein the modulated signal is one of a frequency modulated (FM) signal or a phase modulated (PM) signal.

8. The method of claim 6, further comprising:
   receiving an instantaneous divider value generated from the communication information;

dividing a frequency of the carrier signal with the instantaneous divider value to produce a modulated signal frequency; and transferring noise located within a predetermined range of the modulated signal frequency to a preset frequency.

9. A method comprising:

receiving a carrier signal at a divider, the carrier signal received from a generation source remote from the divider;

receiving a control signal at the divider, the control signal based on communication information;

modulating the communication information onto the carrier signal to produce a modulated signal based on the control signal;

outputting the modulated signal; and feeding a feedback signal, output by the divider, back into the divider to provide timing, or feeding the modulated signal back into the divider to provide timing, or feeding a feedback signal into a control circuit to provide timing for the control circuit and to trigger the control circuit to generate a divider value, wherein the feedback signal is output by the divider, or feeding the modulated signal into a control circuit to provide timing for the control circuit and to trigger the control circuit to generate a divider value.

10. The method of claim 6, further comprising outputting the modulated signal to a transmitter driver to provide control for the transmitter driver.

11. A communication system comprising:

a signal generation stage configured to generate a radio frequency (RF) carrier signal;

a modulation stage electrically coupled to the signal generation stage, the modulation stage including:

a control element configured to receive communication information, output a control signal based on the communication information, and output an instantaneous divider value based on an instantaneous frequency of the communication information; and a divider element located outside of the signal generation stage, the divider element configured to modulate the communication information onto the RF carrier signal based on the control signal to produce a modulated signal, receive the instantaneous divider value, divide a frequency of the RF carrier signal with the instantaneous divider value to produce a modulated signal frequency, and output the modulated signal at the modulated signal frequency; and a transmission stage electrically coupled to the modulation stage, the transmission stage including a driver element configured to output the modulated signal to an antenna.

12. The communication system of claim 11, wherein the modulation stage further includes a feedback loop configured to feed a feedback signal output by the divider element into at least one of the control element or the divider element.

13. The communication system of claim 11, wherein the divider element is configured to provide noise shaping based on the control signal, the divider element being configured to provide the noise shaping by transferring noise located within a predetermined range of the modulated signal frequency to a preset frequency.

14. An apparatus, comprising:

a divider configured to receive a radio frequency (RF) carrier signal; and a generation source to supply the RF carrier signal, the generation source being remote from the divider, wherein the divider is configured to: receive a control signal; modulate the RF carrier signal based on the control signal; output a modulated signal; and provide noise shaping based on the control signal, wherein the divider is configured to provide the noise shaping by transferring noise located within a predetermined frequency range of the modulated signal to a preset frequency.

15. The apparatus of claim 14, wherein the divider is configured to receive an instantaneous divider value and divide a frequency of the RF carrier signal with the instantaneous divider value to produce a modulated signal frequency.

* * * * *